(12) United States Patent
Higashi et al.

(10) Patent No.: US 11,776,849 B2
(45) Date of Patent: *Oct. 3, 2023

(54) THROUGH SILICON VIA FABRICATION

(71) Applicant: Quantinuum LLC, Broomfield, CO (US)

(72) Inventors: Robert Edward Higashi, Shorewood, MN (US); Son Thai Lu, Plymouth, MN (US); Elenita Malasmas Chanhvongsak, Lakeville, MN (US)

(73) Assignee: Quantinuum LLC, Broomfield, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/822,596

(22) Filed: Aug. 26, 2022

(65) Prior Publication Data

US 2022/0406659 A1     Dec. 22, 2022

Related U.S. Application Data

(63) Continuation of application No. 17/095,856, filed on Nov. 12, 2020, now Pat. No. 11,430,695, which is a continuation of application No. 16/410,694, filed on May 13, 2019, now Pat. No. 10,867,855.

(51) Int. Cl.
  *H01L 21/768*     (2006.01)
  *H01L 23/48*      (2006.01)
  *H01L 23/532*     (2006.01)

(52) U.S. Cl.
  CPC .. *H01L 21/76898* (2013.01); *H01L 21/76831* (2013.01); *H01L 21/76844* (2013.01); *H01L 21/76873* (2013.01); *H01L 23/481* (2013.01); *H01L 23/53238* (2013.01)

(58) Field of Classification Search
  CPC ......... H01L 21/76831; H01L 21/76844; H01L 21/76873; H01L 21/76898; H01L 23/481
  See application file for complete search history.

(56) References Cited

U.S. PATENT DOCUMENTS

| | | |
|---|---|---|
| 8,390,120 B2 | 3/2013 | Moon et al. |
| 10,867,855 B2 * | 12/2020 | Higashi ................. H01L 23/481 |
| 11,430,695 B2 * | 8/2022 | Higashi ............. H01L 21/76831 |
| 2005/0064707 A1 | 3/2005 | Sinha |

(Continued)

FOREIGN PATENT DOCUMENTS

| | | |
|---|---|---|
| CN | 111933575 A | 11/2020 |
| JP | 2009129953 A | 6/2009 |

(Continued)

OTHER PUBLICATIONS

"U.S. Appl. No. 16/410,694, Notice of Allowance dated Aug. 14, 2020", 7 pgs.

(Continued)

*Primary Examiner* — Daniel P Shook
(74) *Attorney, Agent, or Firm* — Schwegman Lundberg & Woessner, P.A.

(57) ABSTRACT

One or more embodiments are directed to establishing electrical connections through silicon wafers with low resistance and high density, while at the same time maintaining processability for further fabrication. Such connections through silicon wafers enable low resistance connections from the top side of a silicon wafer to the bottom side of the silicon wafer.

20 Claims, 8 Drawing Sheets

(56) References Cited

U.S. PATENT DOCUMENTS

| | | |
|---|---|---|
| 2009/0134498 A1 | 5/2009 | Ikeda et al. |
| 2009/0302480 A1 | 12/2009 | Birner |
| 2010/0206737 A1 | 8/2010 | Preisser |
| 2012/0258590 A1 | 10/2012 | Chen et al. |
| 2014/0217603 A1 | 8/2014 | Moon |
| 2017/0168025 A1 | 6/2017 | Wang et al. |
| 2020/0365459 A1 | 11/2020 | Higashi et al. |
| 2021/0082759 A1 | 3/2021 | Higashi et al. |

FOREIGN PATENT DOCUMENTS

| | | |
|---|---|---|
| JP | 2010212506 A | 9/2010 |
| JP | 2012009847 A | 1/2012 |
| JP | 2013131600 A | 7/2013 |
| JP | 2017112187 A | 6/2017 |
| JP | 2018195661 A | 12/2018 |
| JP | 6968222 B2 | 10/2021 |

OTHER PUBLICATIONS

"U.S. Appl. No. 17/095,856, Non Final Office Action dated Mar. 24, 2022", 6 pgs.

"U.S. Appl. No. 17/095,856, Notice of Allowance mailed Apr. 20, 2022", 5 pgs.

"U.S. Appl. No. 17/095,856, Response filed Apr. 1, 2022 to Non Final Office Action dated Mar. 24, 2022", 8 pgs.

"Canadian Application Serial No. 3,075,107, Office Action dated May 3, 2021", 6 pgs.

"Canadian Application Serial No. 3,075,107, Response filed Sep. 2, 2021 to Office Action dated May 3, 2021", 28 pgs.

"European Application Serial No. 20161664.6, Extended European Search Report dated Sep. 16, 2020", 5 pgs.

"European Application Serial No. 20161664.6, Response filed May 17, 2021 to Communication pursuant to Rules 70(2) and 70a(2) dated Nov. 23, 2020", 5 pgs.

"Japanese Application Serial No. 2020-044294, Notification of Reasons for Refusal dated May 7, 2021", (w/ English Translation), 10 pgs.

"Japanese Application Serial No. 2020-044294, Response filed Jul. 14, 2021 to Notification of Reasons for Refusal dated May 7, 2021", (w/ English Translation of Claims), 11 pgs.

"Canadian Application Serial No. 3,075,107, Examiners Rule 86(2) Report dated Feb. 1, 2023", 3 pgs.

"Japanese Application Serial No. 2021-174264, Notification of Reasons for Refusal dated Dec. 27, 2022", w/ English Translation, 7 pgs.

"Japanese Application Serial No. 2021-174264, Response filed May 17, 2023 to Notification of Reasons for Refusal dated Dec. 27, 2022", with English claims, 11 pages.

\* cited by examiner

THROUGH SILICON VIA FABRICATION

RELATED APPLICATIONS

This application is a continuation of and claims priority to U.S. application Ser. No. 17/095,856, filed on Nov. 12, 2020, which is a continuation of U.S. application Ser. No. 16/410,694, filed on May 13, 2019, and now U.S. Pat. No. 10,867,855. The contents of the foregoing are hereby incorporated by reference in their entirety.

TECHNICAL FIELD

The present disclosure relates to the formation of through silicon vias in a silicon wafer.

BACKGROUND

Some prior technologies for establishing connections from the top side of silicon wafers to the bottom side of silicon wafers include doped silicon posts formed by isolation (Silex), doped polysilicon posts, metal posts, and hollow metal rings within isolation rings. Silicon as a conductor has electrical limits at low temperature as well as significant resistances (of the order of ohms), whereas metal such as copper could have milliohm resistance levels. Solid metal posts provide the lowest resistance per volume, but they are likely to have the highest contrast in thermal expansion mis-match between the metal and the silicon wafer or substrate.

DETAILED DESCRIPTION

Figure 1A:
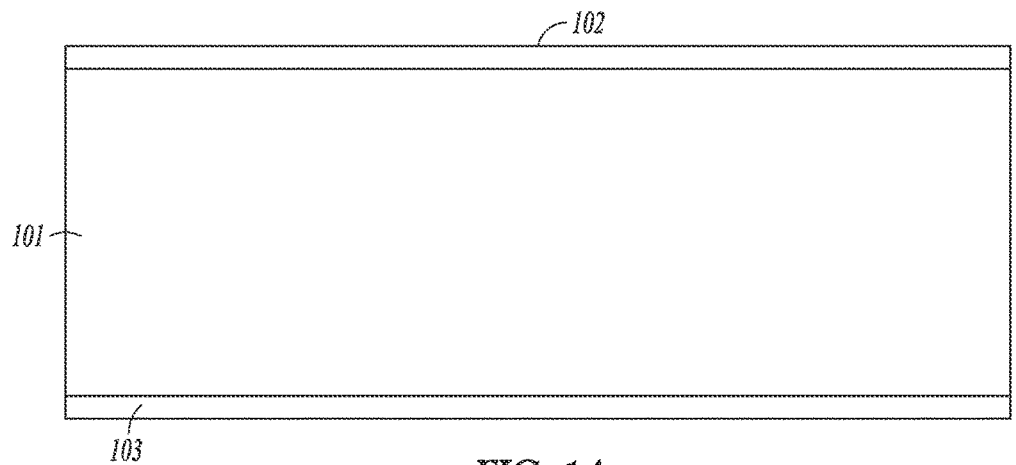
FIGS. 1A through 1M illustrate a process to fabricate through silicon vias.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, electrical, and optical changes may be made without departing from the scope of the present invention. The following description of example embodiments is, therefore, not to be taken in a limited sense, and the scope of the present invention is defined by the appended claims.

One or more embodiments are directed to establishing electrical connections through silicon wafers with low resistance and high density, while at the same time maintaining processability for further fabrication. This is normally intended as the beginning of process steps that enable low resistance connections from the top side of a silicon wafer to the bottom side of the silicon wafer.

One or more embodiments provide a moderator of a glass plug combined with a copper ring that results in a thermally more acceptable solution than prior fabrication processes. By starting with larger holes, the through silicon via (TSV) can be etched to greater depths and lined with greater ease. The lined hole can then be filled with a lower expansion coefficient vapor grown glass. The combined structure can then be chemomechanically polished (CMP), which results in a very flat silicon wafer with patterned electrical metal-lined vias through the silicon wafer. Moderate to low temperature devices can then be fabricated on top and back of the wafer to be interconnected by the TSVs. Higher temperature devices can be fabricated prior to the TSV formation if so desired. This allows the potential of having hermetically sealed parts, or bump-bonded parts, rather than wire-bonded connections. Both the top and bottom surfaces of the silicon wafer can be taken advantage of, or the wafers can be stacked as needed.

The following description and figures disclose a process for fabrication of through silicon vias. While the disclosed process starts with smaller holes, the process makes the through silicon vias or holes smaller, and the smaller holes, which better deep reactive-ion etching (DRIE) tools allow, can be lined and then filled to close the holes. Further, when combined with chemomechanical polishing (CMP), the result is a flat wafer more compatible with continued fabrication processes. Conductive liner metals have previously been manufactured, but the holes from these prior processes were open, and the open holes severely limited lithography and fabrication capabilities. Additionally, other processes involve making through silicon vias using chemical vapor deposition (CVD) tungsten, plated copper posts (Micross; www.micross.com), doped silicon (Silex) and other conductors, but the embodiments disclosed herein offer not only the high conductivity of copper but also some stress remediation through a ring configuration.

In an embodiment, after fabrication of the silicon wafer, the silicon wafer is put to use in connection with a laser light that travels along a surface of the silicon wafer. Therefore, there cannot be any wire bonds or other obstructions, or at least only minimal obstructions, on the surface of the wafer. Specifically, the laser light comes in from the side of the wafer and any wire bond or other obstacle that sticks up from the wafer would then interfere with the laser light. To prevent such an interference, an embodiment has electrical connections at the top surface of the wafer, but these electrical connections are brought down to a lower level in the wafer, so that when wire bonds are made to the wafer, those wire bonds will be out of the field of view of the top surface of the wafer and out of the path of any such laser light beam.

Other ways that the issue of obstacles on the surface of a silicon wafer has been addressed is with highly doped silicon or polysilicon hosts that penetrate through the wafer. Such wafers have moderate resistance, and such a high resistance is not workable for many devices. Additionally, some situations require cryogenic temperatures, and silicon isn't as good a conductor at low temperatures as metals are. In another prior system, tungsten vias are formed, but a problem with a tungsten via is that the wafers have to be extremely thin. Similarly, if copper is used in a hole or via, the wafers have to be about 100 microns thick, which makes the fabrication of the device extremely difficult.

Therefore, in an embodiment, the wafers that are used are thicker, for example, about 300 microns thick. And rather than completely filling the hole or via with copper, the hole at first is made a little bigger, so that the wafer can be thicker and subsequently lined with copper. When the wafer approaches around 300 microns thick, the copper expands, and when the temperature is changed a great deal as with cryogenic applications, the silicon wafer will break more easily. Consequently, in an embodiment, copper is plated on the wafer such that the copper lines the hole, but the copper doesn't completely fill the hole. When lining the hole with copper, an oval hole works well because the challenge with putting the copper in the hole is finding a way to deposit it all the way through the wafer, and most deposition techniques deposit copper on flat surfaces, but they are very poor at depositing the copper on side walls of wafers, especially side walls that are relatively deep (that is, about 300 microns). For a round hole, the hole has to be relatively large, for example about 60-70 microns. It is not really feasible to fill a hole that is that large. However, when the hole is oval, copper deposits nicely in the hole with plating, and in particular, when using a seed layer prior to the electroplating. More particularly, with an oval hole of a size of about 20 by 70 micrometers, a seed layer can be sputter deposited through a 300 micron wafer by sputter depositing on the top of the wafer and then flipping the wafer over and sputter depositing the bottom side of the wafer. About 2-3 microns are sputter deposited on the surface of the wafer. While it may not be certain how much copper is in the hole at this point, the copper does plate to about 2-3 microns on the surface of the wafer. In an embodiment, the oval is about 20 microns by anywhere between 50 and 70 microns long. That is, in an embodiment, the oval is essentially a 20 micron circle that is cut in half, and extended into an oval with two straight sides. With the oval shape, the wafer can be sputter deposited, which results in a continuous coating of a seed layer inside the holes, and then copper can be electroplated into the holes. With the proper chemistry, a layer of copper of about 3 microns is formed in the holes. This closes the hole quite a bit, but it does not completely close the hole.

It is noted that the sputter depositing occurs largely on the surface of the silicon wafer. However, an important part of the sputter depositing occurs within the via, but it is very thin, only about a thousand or two thousand Angstroms. The sputter deposition within the via only needs to be thick enough so that it is electrically conductive and so that the copper plating solution will plate to it. The oval shape of the vias assists here, since along the length of the oval there are more degrees of freedom for the sputtering atoms to contact the sides of the vias. In contrast, with a round via of approximately 20 micrometers, the sputtering will not penetrate very deeply into the vias, particularly, the sputtering only penetrates about ⅓ or ¼ of the way down into the round via. It is beneficial that the inside of the via is completely coated. If there are areas of the via that do not plate, that is if a seed layer is not properly put into place and the via does not plate, the resistance of the via connection would be rather large. Also, after the seed layer is deposited, the wafer is placed into a plating solution to plate copper sufficiently to give a low resistance, but not so much that the hole is plugged. Once again, this is about 3 micrometers of copper. In short, the sputter depositing deposits some copper in the via, but mostly on the surface of the wafer, and the electroplating deposits the copper mostly within the via.

After the copper has been deposited by electroplating, resulting in a copper-lined oval hole going through the wafer, an adhesion layer of titanium tungsten is sputter deposited on the copper. This adhesion layer is primarily on the top and bottom surfaces, but some penetrates into the holes also. Thereafter, about 5-8 microns of silicon dioxide is deposited using tetraethyl orthosilicate (TEOS). The TEOS on the top and bottom of the wafer covers the wafer, but it is not enough to plug the holes. The wafer is then placed into a plasma etcher, and almost all of the TEOS that has been deposited is etched back. The etching here is directional, so that there is a removal of the silicon dioxide from the top surface and also a removal of some of the silicon dioxide near the tops of the holes. A reason for doing this rather than depositing it (the TEOS) all at once is that when depositing it in a hole, the result is what is described as a bread loaf top. With a bread loaf top, the silicon dioxide will tend to pinch off at the top which will prevent the silicon dioxide from filling the hole because it closes on the top, but there is still a hole or keyhole. This is often below the surface and should be avoided. When the subsequent etch is performed and the silicon dioxide is removed from the top, that removes the bread loaf off. Thereafter, depositing takes place once again, and the hole is filled in deeper in the wafer. This may only have to be done once or twice. That is, there is a deposit, an etch back, another deposit, another etch back, and then a last deposit.

After the two cycles on top and two cycles on the bottom of the wafer, the wafer has oval, copper-lined vias with silicon cores (several microns of silicon dioxide). Then a mechanical polish is performed on the top surface of the wafer such that the silicon dioxide is polished off. That is, the flat part of the silicon dioxide is polished down to the copper. Then, the same polishing is performed on the bottom of the wafer, and the copper surfaces are exposed. A subsequent chemical-mechanical polish is performed with a slurry that is designed for copper, and the copper is taken off the top and bottom of the wafer. The result is a through silicon via (TSV) with copper rings exposed.

FIGS. 1A through 1M illustrate an embodiment of fabricating these through silicon vias in a silicon wafer. Referring to FIG. 1A, a top mask 102 of silicon dioxide is deposited on a silicon wafer 101. A photoresist can also be deposited on the top mask 102. As noted above, the silicon wafer 101 is normally about 300 micrometers thick. It is noted at this point that when it is stated herein that a feature of the silicon wafer is an approximate width or thickness, in an embodiment, that means that that feature is within about 10-15% of the recited magnitude. The top mask of silicon dioxide is approximately 1-4 micrometers thick. FIG. 1A further illustrates the deposition of a bottom mask 103 on the silicon wafer 101. The bottom mask 103 is an aluminum layer, and is normally about 1-2 micrometers thick. The use of aluminum as the bottom mask 103, rather than a mask of silicon dioxide for example, is that when there is the subsequent etch down to the bottom mask, little undercuts on the bottom of the silicon wafer are avoided (which would happen if the bottom mask is silicon dioxide rather than aluminum).

Figure 1B:
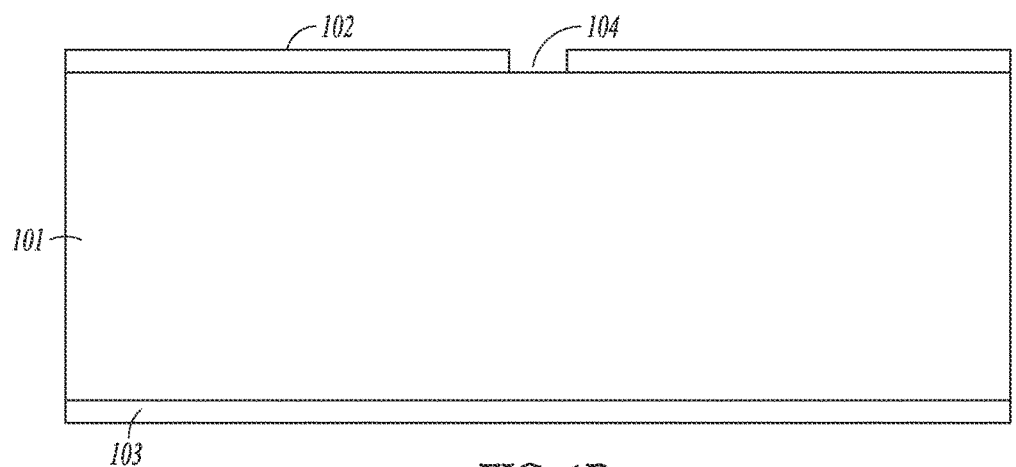
Figure 1C:
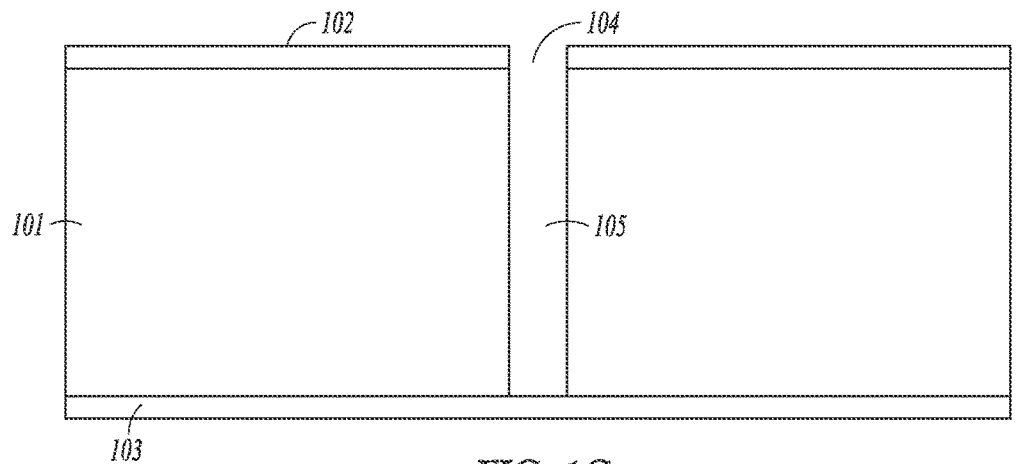

Referring to FIGS. 1B and 1C, a through silicon via pattern 104 is photopatterned and etched into the top mask 102. Then, a through silicon via 105 is etched, using the through silicon via photopattern, through the silicon wafer 101 to the bottom mask 103. In an embodiment, the etching the through silicon via 105 through the silicon wafer to the bottom mask 103 is a deep reactive-ion etching (DRIE). In another embodiment, the through silicon via 105 is a rounded-corner rectangle or ovals having dimensions of approximately 20 micrometers to 50 micrometers or 20 micrometers to 70 micrometers. As noted above, these oval vias can be formed from dissected circles that are extended with inserted straight, parallel walls.

Figure 1D:
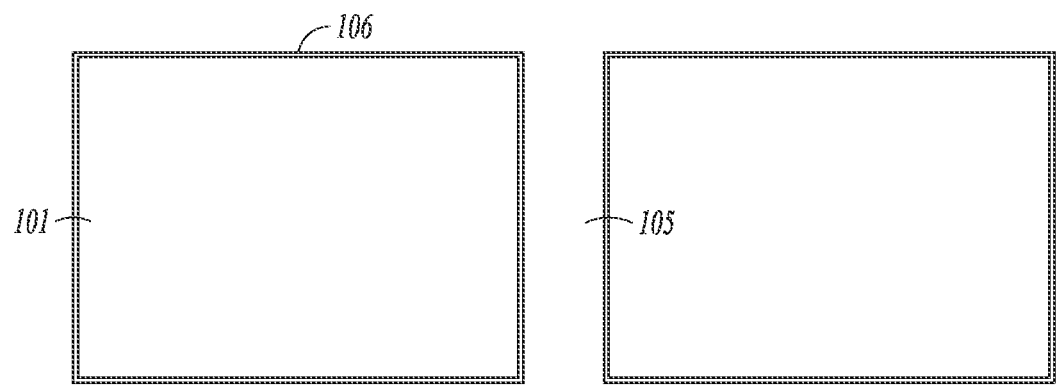

Referring now to FIG. 1D, the top mask 102 and the bottom mask 103 are removed from the silicon wafer 101, and a second thermal silicon dioxide layer 106 is grown on the top of the silicon wafer, the bottom of the silicon wafer, and the through silicon via 105. In an embodiment, the second thermal silicon dioxide layer is approximately 1.5 micrometers thick.

Figure 1E:
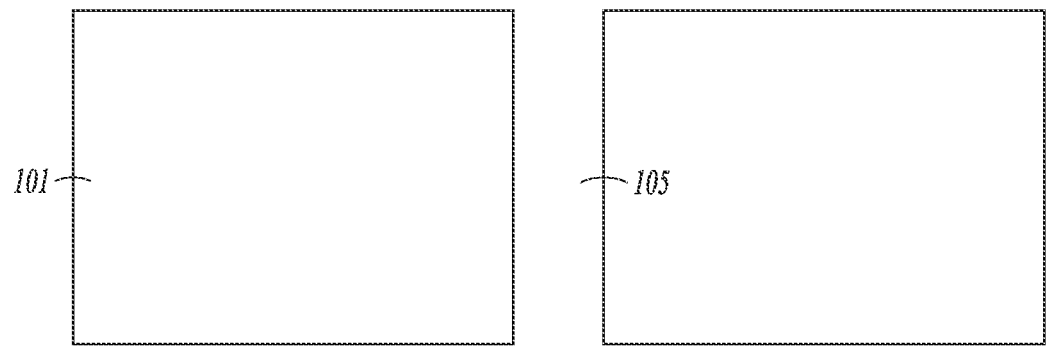

Referring to FIG. 1E, the second thermal silicon dioxide layer 106 is etched off the silicon wafer 101. In an embodiment, the etching of the second thermal silicon dioxide layer 106 involves a wet etching. The wet etching widens the through silicon via 105 to approximately 21 micrometers. The wet etching further smooths any scallops that have formed on the silicon wafer from the deep reactive-ion etch. It can be beneficial to remove such scallops because when a subsequent seed layer and electroplating is performed, such scallops can cause difficulties in coating the through silicon via 105 with the seed layer. To address this, the second silicon dioxide layer 106 is grown to about a micrometer in thickness, and then the second silicon oxide layer is etched off. This etching oxidizes the sharper points in the silicon more so than the flatter parts in the silicon, and this smooths the silicon surface.

Figure 1F:
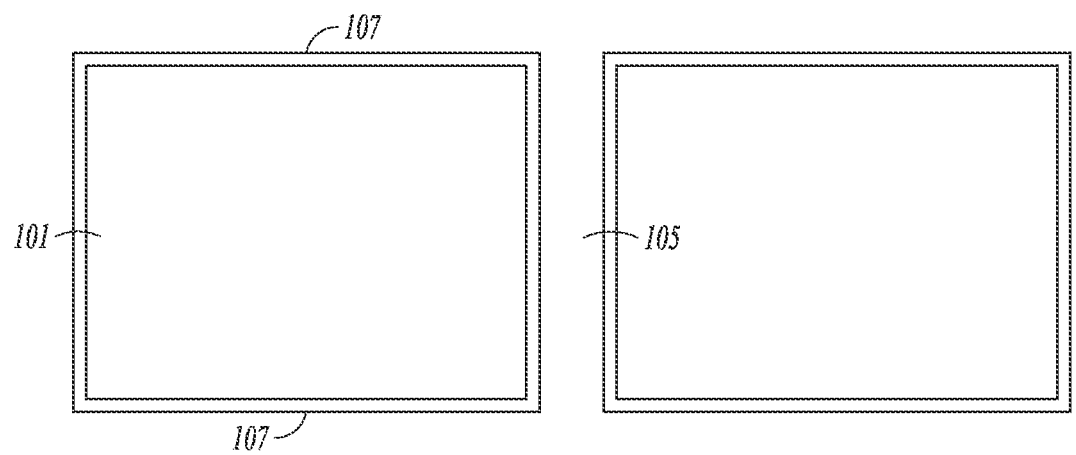

Referring to FIG. 1F, a third thermal silicon oxide layer 107 is grown on the top of the silicon wafer, the bottom of the silicon wafer, and the through silicon via. This third silicon oxide layer 107 forms a passivation layer, and ultimately serves as an insulation layer and a stop layer (for the subsequent chemomechanical polishing (CMP) so that the polishing does not go all the way down to the silicon wafer and cause leakage between adjacent through silicon vias) in the through silicon via 105. In an embodiment, the third thermal silicon dioxide layer 107 is approximately 1.5 micrometers thick. The growing of the third thermal silicon dioxide layer 107 narrows the through silicon via to approximately 19.5 micrometers. The third silicon dioxide layer 107 results in a chemomechanically polished (CMP) stop layer.

Figure 1G:
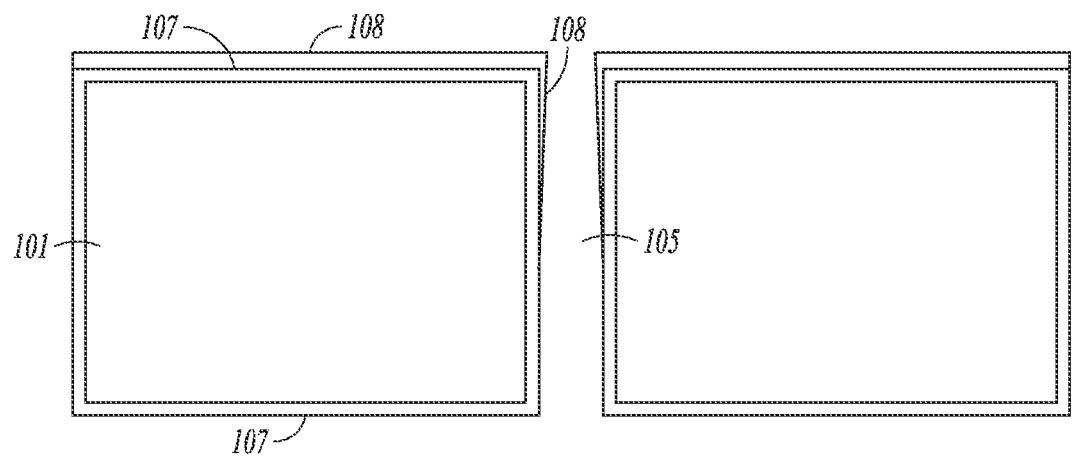
Figure 1H:
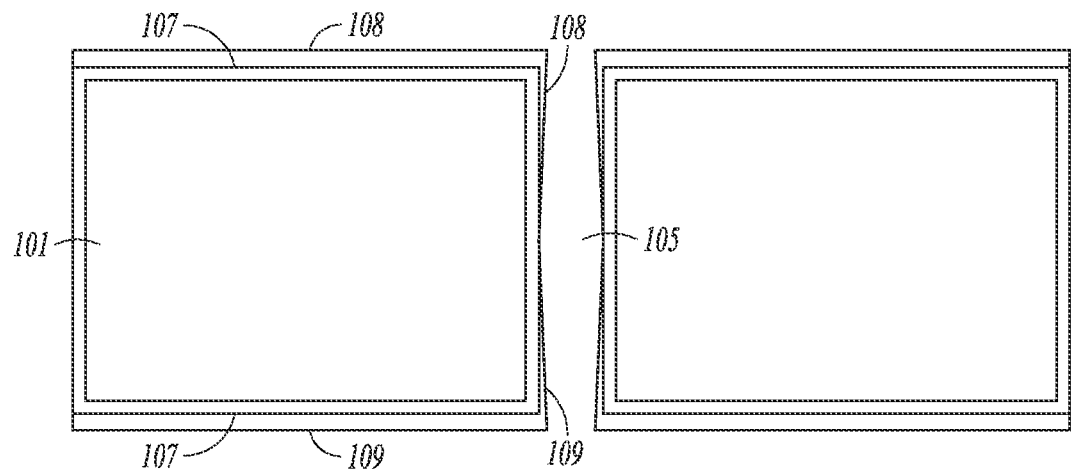

Referring to FIG. 1G, an adhesion layer 108 is sputter deposited on the top of the silicon wafer. The sputtering deposition deposits about 2500 Angstroms of titanium. Referring to FIG. 1H, the silicon wafer is flipped over and about 2500 Angstroms of titanium are sputter deposited on the bottom of the silicon wafer thereby forming adhesion layer 109. These sputtering depositions also penetrate somewhat into the through silicon via, and this narrows the through silicon via to approximately 19.4 micrometers.

Figure 1I:
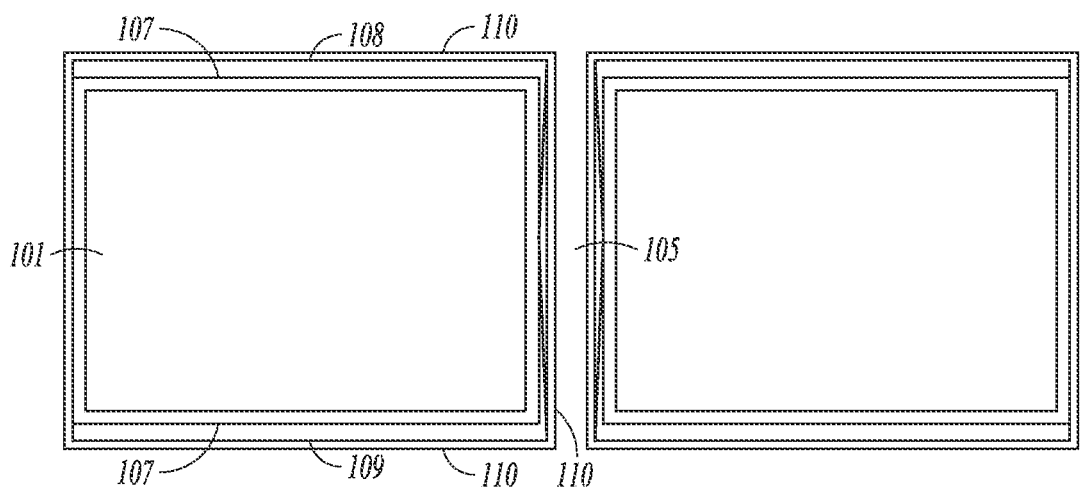

Referring to FIG. 1I, a plating seed layer (not shown in FIG. 1I) is deposited on the top of the silicon wafer, the bottom of the silicon wafer, and the through silicon via in a method equivalent to the sputtered adhesion layer but with copper. The seed layer deposited in the through silicon via 105 is a very small percent of the thickness on the surfaces. However, it is beneficial for the subsequent electroplating. After plating the seed layer, a copper layer 110 is electroplated in the through silicon via. The electroplating of the copper layer in the through silicon via results in the copper layer penetrating into the through silicon via to a depth of approximately 3 micrometers and a narrowing of the through silicon via to approximately 13.4 micrometers. After the electroplating, a second adhesion layer (not illustrated in FIG. 1I) is deposited on the top of the silicon wafer and the bottom of the silicon wafer. This second adhesion layer on the top of the silicon wafer and the bottom of the silicon wafer is a titanium tungsten layer having a thickness of approximately 2000 angstroms. The foregoing are some examples. A challenge here is that an electrically conductive layer is needed that goes completely through the vias. That layer needs to be like copper so that it can be plated. Copper simply cannot be electroplated to that many materials.

Figure 1J:
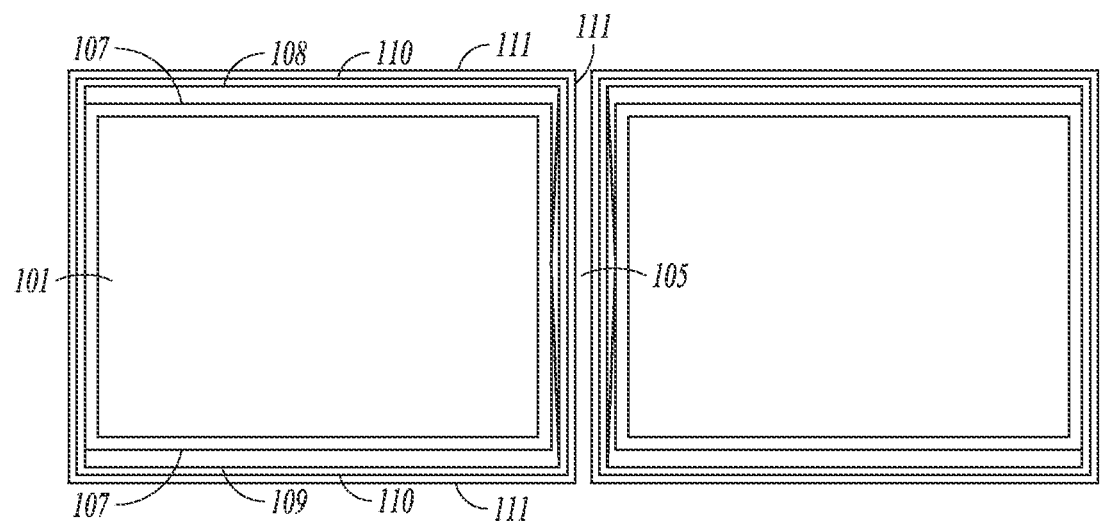

Referring to FIG. 1J, a fourth silicon dioxide layer 111 is deposited on the top of the silicon wafer, the bottom of the silicon wafer, and the through silicon via. The deposition of the fourth silicon dioxide layer on the top of the silicon wafer and the bottom of the silicon wafer involves a plasma enhanced chemical vapor deposition using tetraethyl orthosilicate (TEOS) chemistry. This chemical vapor deposition narrows the through silicon via to approximately 3.4 micrometers, and results in the fourth silicon dioxide layer being approximately 5 micrometers thick.

Still referring to FIG. 1J, the fourth silicon dioxide layer 111 is etched to remove a portion of the fourth silicon dioxide layer. The etching of the fourth silicon dioxide layer to remove a portion of the fourth silicon dioxide layer includes a directional dry etch. The directional dry etch removes approximately 4.5 micrometers of the fourth silicon dioxide layer on the outward facing surfaces of the top and bottom of the wafer, and results in the through silicon via 105 being approximately 12.4 micrometers near the top of the silicon wafer and the through silicon via being approximately 4 micrometers near a midpoint of the through silicon via and near the bottom of the silicon wafer. A fifth silicon dioxide layer (not illustrated in FIG. 1J) is then deposited on the top of the silicon wafer, the bottom of the silicon wafer, and the through silicon via. The deposition of the fifth silicon dioxide layer on the top of the silicon wafer and the bottom of the silicon wafer involves a plasma enhanced chemical vapor deposition using tetraethyl orthosilicate (TEOS) chemistry. The plasma enhanced chemical vapor deposition narrows the through silicon via to approximately 2.4 micrometers at the top of the silicon wafer, and closes the through silicon via near the top of the silicon wafer, a midpoint of the silicon wafer, and the bottom of the silicon wafer. The fifth silicon dioxide layer is approximately 5 micrometers thick.

The fifth silicon dioxide layer is then etched to remove a portion of the fifth silicon dioxide layer. The etching of the fifth silicon dioxide layer to remove a portion of the fifth silicon dioxide layer involves a directional dry etch. The directional dry etch removes approximately 4.5 micrometers of the fifth silicon dioxide layer on the outward facing surfaces of the top and bottom of the wafer, and results in the through silicon via having a thickness of approximately 12.4 micrometers at the top of the silicon wafer, and further results in a closing the through silicon via within the silicon wafer and at the bottom of the silicon wafer.

Figure 1K:
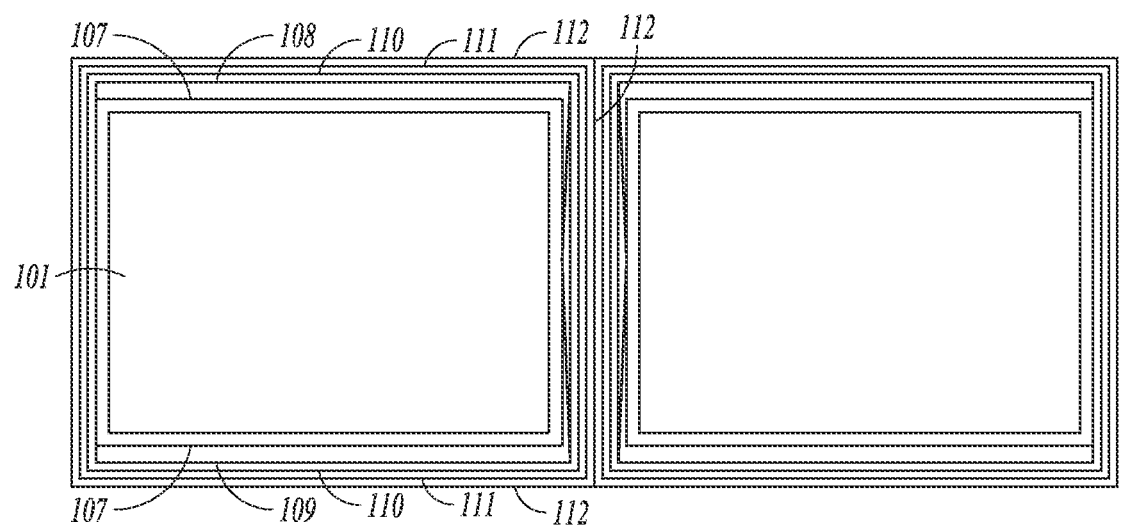

Referring to FIG. 1K, a sixth silicon dioxide layer 112 is deposited on the top of the silicon wafer and the bottom of the silicon wafer. The deposition of the sixth silicon dioxide layer on the top of the silicon wafer and the bottom of the silicon wafer involves a plasma enhanced chemical vapor deposition using tetraethyl orthosilicate (TEOS) chemistry. The plasma enhanced chemical vapor deposition closes the through silicon via at the top of the silicon wafer, a midpoint of the silicon wafer, and the bottom of the silicon wafer, and further results in a sixth silicon dioxide layer 112 that is approximately 5 micrometers thick.

Figure 1L:
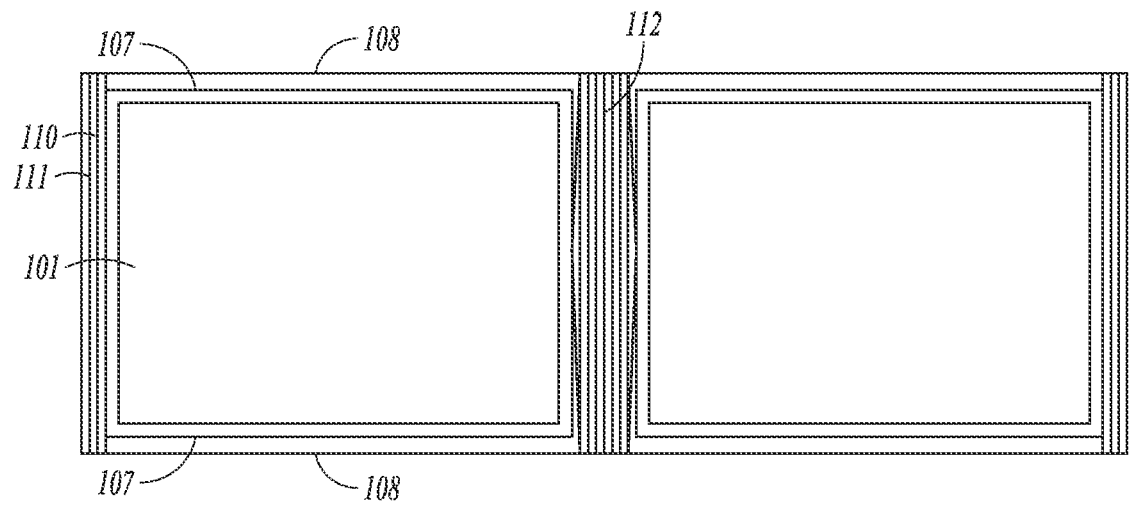
Figure 1M:
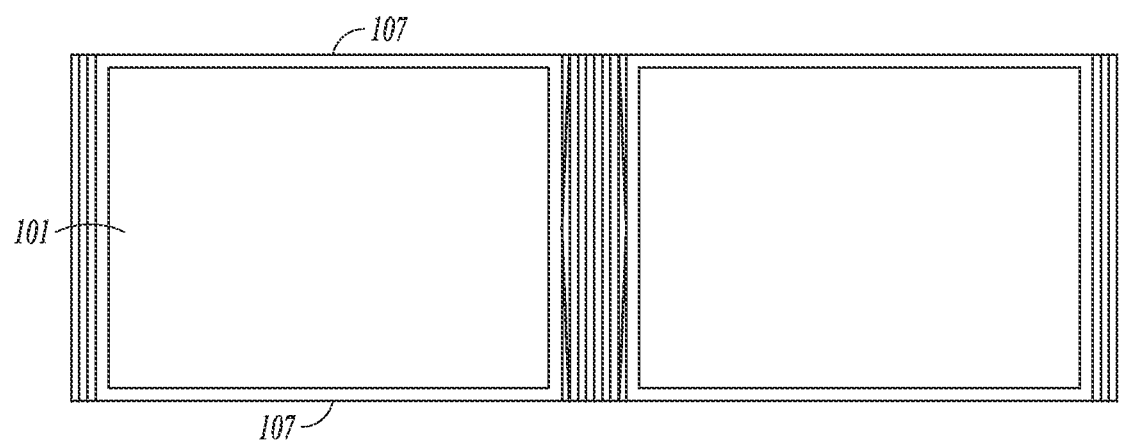

Referring to FIG. 1L, the sixth silicon dioxide layer 112 is chemomechanically polished (CMP) down to the copper layer 110 on the top of the silicon wafer and the bottom of the silicon wafer. Then, referring to FIG. 1M, the copper layer 110, the first adhesion layer, and the second adhesion layer are chemomechanically polished down to the silicon dioxide layer 107.

Figure 2:
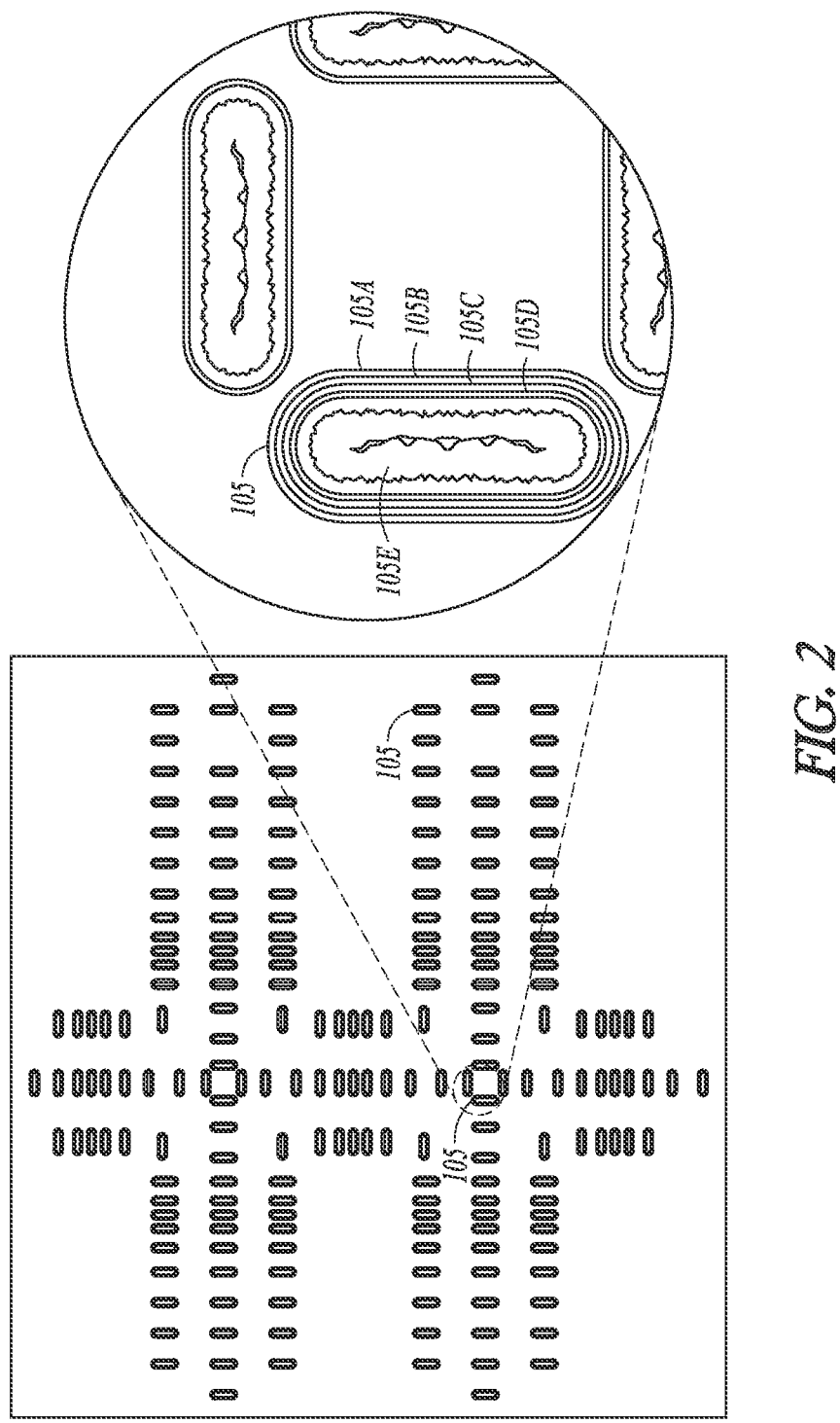
FIG. 2 illustrates a pattern of through silicon vias and a structure of a through silicon via.

FIG. 2 illustrates a pattern of through silicon vias 105. The through silicon via 105 includes a 1 micrometer thermal silicon dioxide layer 105A, the titanium and copper seed layer 105B, approximately 4-5 micrometers of electroplated copper 105C, a 0.1 micrometer layer of titanium 105D, and a TEOS-filled middle 105E.

Figure 3A:
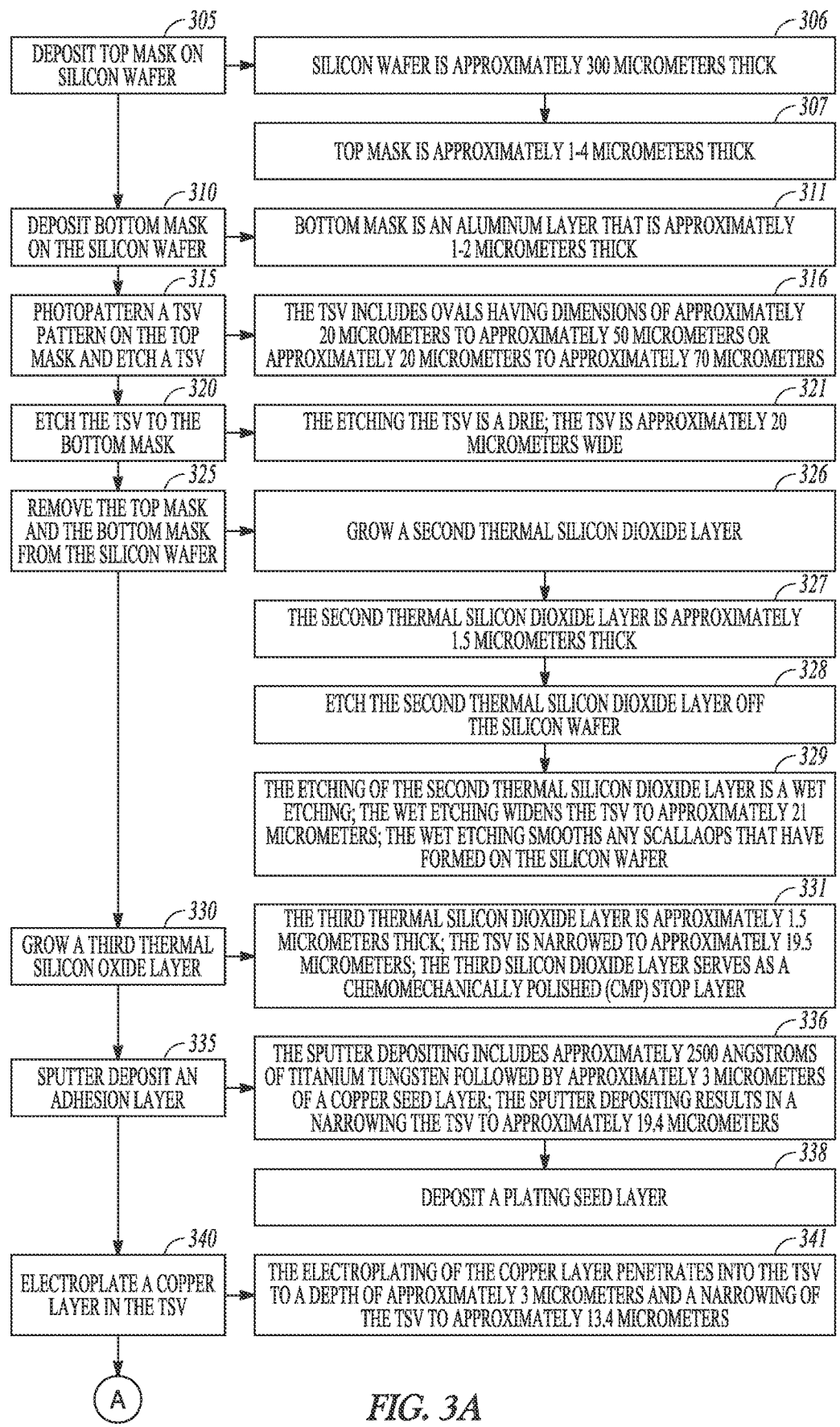
FIGS. 3A and 3B are a flowchart illustrating a process to fabricate through silicon vias.
Figure 3B:
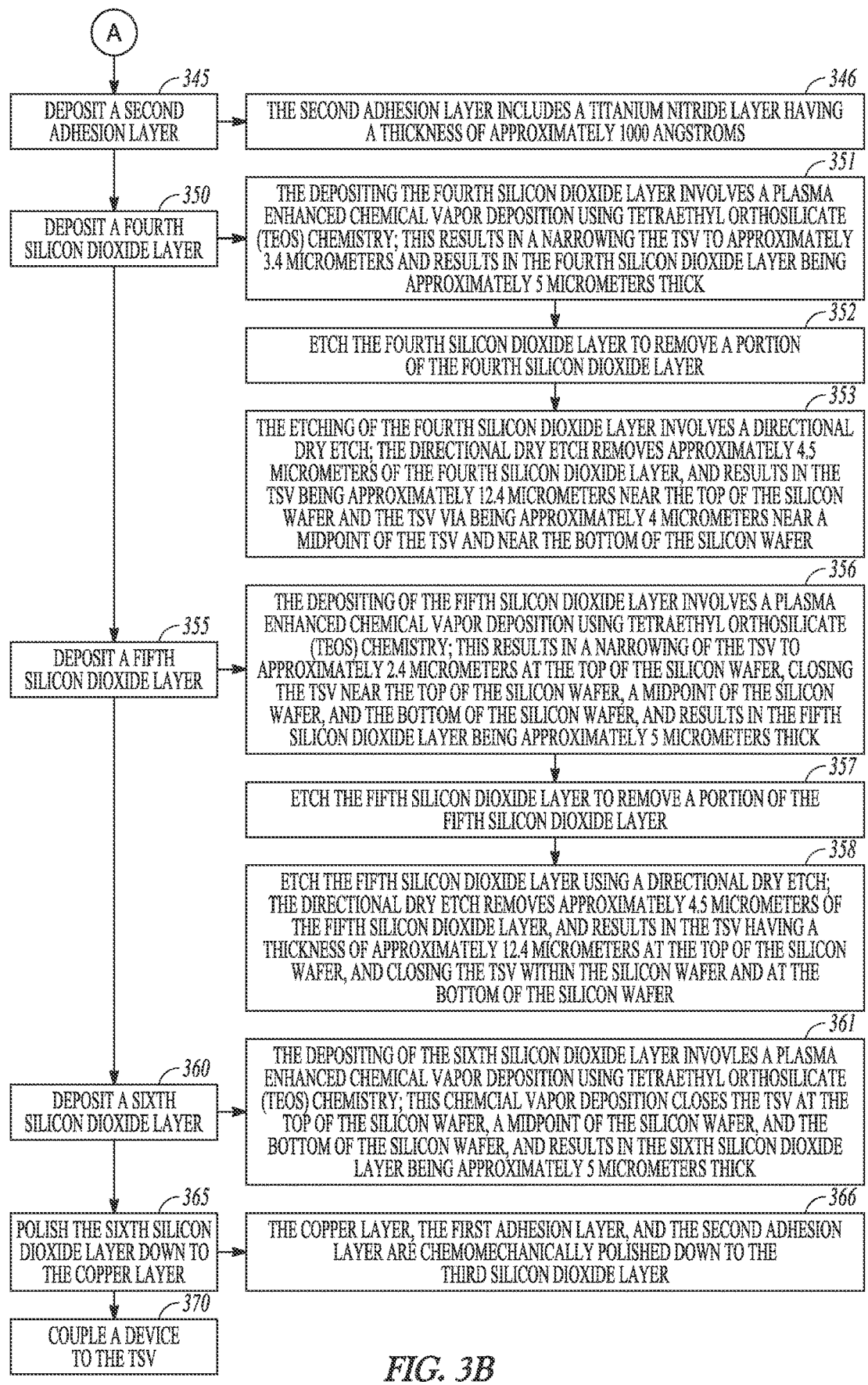

FIGS. 3A and 3B are a block diagram illustrating operations and features of a system and method 300 to fabricate through silicon vias (TSV) in silicon wafers. FIGS. 3A and 3B include a number of blocks 305-370. Though arranged substantially serially in the example of FIGS. 3A and 3B, other examples may reorder the blocks, omit one or more blocks, and/or execute two or more blocks in parallel using multiple processors or a single processor organized as two or more virtual machines or sub-processors. Moreover, still other examples can implement the blocks as one or more specific interconnected hardware or integrated circuit modules with related control and data signals communicated between and through the modules. Thus, any process flow is applicable to software, firmware, hardware, and hybrid implementations.

Referring now to FIGS. 3A and 3B, at 305, a top mask 102 is deposited onto a silicon wafer 101. The top mask is a first silicon dioxide layer. As noted at 306, the silicon wafer is approximately 300 micrometers thick, and as noted at 307, the top mask is approximately 1-4 micrometers thick. At 310, a bottom mask 103 is depositied onto the bottom of the silicon wafer 101. As indicated at 311, in an embodiment, the bottom mask is an aluminum layer, and the aluminum layer is approximately 1-2 micrometers thick.

At 315, a through silicon via is photopatterned (104) onto the top mask 102, and thereafter a through silicon via 105 is etched into the top mask. As indicated at 316, in an embodiment, the through silicon via includes rounded-corner rectangles or ovals having dimensions of approximately 20 micrometers to approximately 50 micrometers or approximately 20 micrometers to approximately 70 micrometers. See FIG. 2.

At 320, the through silicon via 105 is etched, using the through silicon via pattern, through the silicon wafer 101 to the bottom mask 103. As indicated at 321, in an embodiment, the etching the through silicon via through the silicon wafer to the bottom mask is a deep reactive-ion etching (DRIE), resulting in a through silicon via that is approximately 20 micrometers wide.

At 325, the top mask 102 and the bottom mask 103 are removed from the silicon wafer 101. And at 326, a second thermal silicon dioxide layer 106 is grown on the top of the silicon wafer, the bottom of the silicon wafer, and the through silicon via 105. As indicated at 327, in an embodiment, the second thermal silicon dioxide layer is approximately 1.5 micrometers thick. At 328, the second thermal silicon dioxide layer is etched off the silicon wafer. As indicated at 329, the etching of the second thermal silicon dioxide layer in an embodiment includes a wet etching, the wet etching widens the through silicon via to approximately 21 micrometers, and the wet etching smooths any scallops that have formed on the silicon wafer.

At 330, a third thermal silicon oxide layer 107 is grown on the top of the silicon wafer, the bottom of the silicon wafer, and the through silicon via. This third silicon dioxide layer forms a passivation layer. In an embodiment, as indicated at 331, the third thermal silicon dioxide layer is approximately 1.5 micrometers thick, the growing of the third thermal silicon dioxide layer narrows the through silicon via to approximately 19.5 micrometers, and the third silicon dioxide layer serves as a chemomechanically polished (CMP) stop layer.

At 335, an adhesion layer 108 is sputter deposited on the top of the silicon wafer, the bottom of the silicon wafer, and the through silicon via. At 336, the sputter depositing of the the adhesion layer on the top of the silicon wafer and the bottom of the silicon wafer includes sputter depositing approximately 2500 Angstroms of titanium tungsten followed by approximately 3 micrometers of a copper seed layer on the top of the silicon wafer and the bottom of the silicon wafer. This sputter depositing results in a narrowing the through silicon via to approximately 19.4 micrometers. Thereafter, at 338, a plating seed layer is deposited on the top of the silicon wafer, the bottom of the silicon wafer, and the through silicon via.

At 340, a copper layer 110 is electroplated in the through silicon via 105. As indicated at 341, the electroplating the copper layer in the through silicon via results in the copper layer penetrating into the through silicon via to a depth of approximately 3 micrometers and a narrowing of the through silicon via to approximately 13.4 micrometers.

At 345, a second adhesion layer is deposited on the top of the silicon wafer and the bottom of the silicon wafer. As indicated at 346, in an embodiment, the second adhesion layer on the top of the silicon wafer and the bottom of the silicon wafer includes a titanium nitride layer having a thickness of approximately 1000 angstroms. The second adhesion layer can be deposited by atomic layer deposition (ALD).

At 350, a fourth silicon dioxide layer 111 is deposited on the top of the silicon wafer, the bottom of the silicon wafer, and the through silicon via. In an embodiment, as indicated at 351, the depositing the fourth silicon dioxide layer on the top of the silicon wafer and the bottom of the silicon wafer involves a plasma enhanced chemical vapor deposition using tetraethyl orthosilicate (TEOS) chemistry. This results in a narrowing the through silicon via to approximately 3.4 micrometers, and results in the fourth silicon dioxide layer being approximately 5 micrometers thick.

At 352, the fourth silicon dioxide layer is etched to remove a portion of the fourth silicon dioxide layer. As indicated at 353, in an embodiment the etching of the fourth silicon dioxide layer that removes a portion of the fourth silicon dioxide layer involves a directional dry etch. The directional dry etch removes approximately 4.5 micrometers of the fourth silicon dioxide layer, and results in the through silicon via being approximately 12.4 micrometers near the top of the silicon wafer and the through silicon via being approximately 4 micrometers near a midpoint of the through silicon via and near the bottom of the silicon wafer.

At 355, a fifth silicon dioxide layer is deposited on the top of the silicon wafer, the bottom of the silicon wafer, and the through silicon via. In an embodiment, as indicated at 356, the depositing of the fifth silicon dioxide layer on the top of the silicon wafer and the bottom of the silicon wafer involves a plasma enhanced chemical vapor deposition using tetraethyl orthosilicate (TEOS) chemistry. This results in a narrowing the through silicon via to approximately 2.4 micrometers at the top of the silicon wafer, closing the through silicon via near the top of the silicon wafer, a midpoint of the silicon wafer, and the bottom of the silicon wafer, and results in the fifth silicon dioxide layer being approximately 5 micrometers thick.

At 357, the fifth silicon dioxide layer is etched to remove a portion of the fifth silicon dioxide layer. At 358, an embodiment etches the fifth silicon dioxide layer to remove a portion of the fifth silicon dioxide layer using a directional dry etch. The directional dry etch removes approximately 4.5 micrometers of the fifth silicon dioxide layer, and results in the through silicon via having a thickness of approximately 12.4 micrometers at the top of the silicon wafer, and closing the through silicon via within the silicon wafer and at the bottom of the silicon wafer.

At 360, a sixth silicon dioxide layer 112 is deposited on the top of the silicon wafer and the bottom of the silicon wafer. At 361, in an embodiment, the depositing of the sixth silicon dioxide layer on the top of the silicon wafer and the bottom of the silicon wafer involves a plasma enhanced chemical vapor deposition using tetraethyl orthosilicate (TEOS) chemistry. This chemical vapor deposition closes the through silicon via at the top of the silicon wafer, a midpoint of the silicon wafer, and the bottom of the silicon wafer, and results in the sixth silicon dioxide layer being approximately 5 micrometers thick.

At 365, the sixth silicon dioxide layer is chemomechanically polished (CMP) down to the copper layer on the top of the silicon wafer and the bottom of the silicon wafer, and at 366, the copper layer, the first adhesion layer, and the second adhesion layer are chemomechanically polished down to the third silicon dioxide layer. This basically completes the process of fabricating the through silicon vias in the silicon wafer. Then, as indicated at 370, a device is coupled to the through silicon via at the top layer of the silicon wafer and/or coupling the device to the through silicon via at the bottom layer of the silicon wafer.

It should be understood that there exist implementations of other variations and modifications of the invention and its various aspects, as may be readily apparent, for example, to those of ordinary skill in the art, and that the invention is not limited by specific embodiments described herein. Features and embodiments described above may be combined with each other in different combinations. It is therefore contemplated to cover any and all modifications, variations, combinations or equivalents that fall within the scope of the present invention.

The Abstract is provided to comply with 37 C.F.R. § 1.72(b) and will allow the reader to quickly ascertain the nature and gist of the technical disclosure. It is submitted with the understanding that it will not be used to interpret or limit the scope or meaning of the claims.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single disclosed embodiment. Thus the following claims are hereby incorporated into the Description of the Embodiments, with each claim standing on its own as a separate example embodiment.

The invention claimed is:

1. A process comprising:
depositing a top mask onto a silicon wafer, the top mask comprising a first silicon dioxide layer;
depositing a bottom mask onto the bottom of the silicon wafer;
photopatterning a through silicon via pattern and etching a through silicon via into the top mask;
etching the through silicon via, using the through silicon via pattern, through the silicon wafer;
growing a second thermal silicon dioxide layer on the top of the silicon wafer, the bottom of the silicon wafer, and the through silicon via;
etching the second thermal silicon dioxide layer;
growing a third thermal silicon dioxide layer on the top of the silicon wafer, the bottom of the silicon wafer, and the through silicon via;
depositing a plating seed layer on the top of the silicon wafer, the bottom of the silicon wafer, and the through silicon via;
electroplating a copper layer in the through silicon via;
depositing a fourth silicon dioxide layer on the top of the silicon wafer, the bottom of the silicon wafer, and the through silicon via;
etching the fourth silicon dioxide layer;
depositing a fifth silicon dioxide layer on the top of the silicon wafer, the bottom of the silicon wafer, and the through silicon via;
etching the fifth silicon dioxide layer;
depositing a sixth silicon dioxide layer on the top of the silicon wafer and the bottom of the silicon wafer;
chemomechanically polishing (CMP) the sixth silicon dioxide layer down to the copper layer; and
chemomechanically polishing the copper layer.

2. The process of claim 1, comprising:
removing the top mask and the bottom mask from the silicon wafer;
depositing an adhesion layer on the top of the silicon wafer, the bottom of the silicon wafer, and the through silicon via; and
depositing a second adhesion layer on the top of the silicon wafer and the bottom of the silicon wafer.

3. The process of claim 2, wherein the depositing the adhesion layer on the top of the silicon wafer and the bottom of the silicon wafer comprises depositing approximately 2500 Angstroms of titanium followed by approximately 3 micrometers of a copper seed layer on the top of the silicon wafer and the bottom of the silicon wafer, thereby narrowing the through silicon via to approximately 19.4 micrometers.

4. The process of claim 2, wherein the second adhesion layer on the top of the silicon wafer and the bottom of the silicon wafer comprises a titanium tungsten layer having a thickness of approximately 2000 angstroms.

5. The process of claim 2, wherein the depositing the adhesion layer on the top of the silicon wafer and the bottom of the silicon wafer comprises depositing approximately 2000 Å titanium tungsten followed by approximately 3 micrometers of a copper seed layer on the top of the silicon wafer and the bottom of the silicon wafer, thereby narrowing the through silicon via to approximately 19.4 micrometers; and wherein the second adhesion layer on the top of the silicon wafer and the bottom of the silicon wafer comprises a titanium nitride layer of approximately 1000 Angstroms, the second adhesion layer deposited by atomic layer deposition (ALD).

6. The process of claim 1, wherein the silicon wafer is approximately 300 micrometers thick.

7. The process of claim 1, wherein the top mask is approximately 1-7 micrometers thick.

8. The process of claim 1, wherein the bottom mask comprises an aluminum layer, and wherein the aluminum layer is approximately 1-2 micrometers thick.

9. The process of claim 1, wherein the through silicon via comprises rounded-corner rectangles or ovals comprising dimensions of approximately 20 micrometers to 50 micrometers or 20 micrometers to 70 micrometers.

10. The process of claim 1, wherein the etching the through silicon via through the silicon wafer comprises etching to the bottom mask, and comprises deep reactive-ion etching (DRIE), and wherein the through silicon via is approximately 20 micrometers wide.

11. The process of claim 1, wherein the second thermal silicon dioxide layer is approximately 1.5 micrometers thick.

12. The process of claim 1, wherein the etching the second thermal silicon dioxide layer comprises etching the second thermal silicon dioxide layer off the silicon wafer, and comprises a wet etching, wherein the wet etching widens the through silicon via to approximately 21 micrometers, and wherein wet etching smooths scallops on the silicon wafer.

13. The process of claim 1, wherein the third silicon dioxide layer comprises a passivation layer, wherein the third thermal silicon dioxide layer is approximately 1.5 micrometers thick, and wherein the growing the third thermal silicon dioxide layer narrows the through silicon via to approximately 19.5 micrometers, and wherein the third silicon dioxide layer comprises a chemomechanically polished (CMP) stop layer.

14. The process of claim 1, wherein the electroplating the copper layer in the through silicon via results in the copper layer penetrating into the through silicon via to a depth of approximately 3 micrometers and a narrowing of the through silicon via to approximately 13.4 micrometers.

15. The process of claim 1, wherein the depositing the fourth silicon dioxide layer on the top of the silicon wafer and the bottom of the silicon wafer comprises a plasma enhanced chemical vapor deposition using tetraethyl orthosilicate (TEOS) chemistry, thereby narrowing the through silicon via to approximately 3.4 micrometers, and resulting in the fourth silicon dioxide layer being approximately 5 micrometers thick; and wherein the etching the fourth silicon dioxide layer removes a portion of the fourth silicon dioxide layer and comprises a directional dry etch, thereby removing approximately 4.5 micrometers of the fourth silicon dioxide layer, and resulting in the through silicon via being approximately 12.4 micrometers near the top of the silicon wafer and the through silicon via being approximately 4 micrometers near a midpoint of the through silicon via and near the bottom of the silicon wafer.

16. The process of claim 1, wherein the depositing the fifth silicon dioxide layer on the top of the silicon wafer and the bottom of the silicon wafer comprises a plasma enhanced chemical vapor deposition using tetraethyl orthosilicate (TEOS) chemistry, thereby narrowing the through silicon via to approximately 2.4 micrometers at the top of the silicon wafer, closing the through silicon via near the top of the silicon wafer, a midpoint of the silicon wafer, and the bottom of the silicon wafer, and resulting in a fifth silicon dioxide layer that is approximately 5 micrometers thick; and wherein the etching the fifth silicon dioxide layer removes a portion of the fifth silicon dioxide layer and comprises a directional dry etch, thereby removing approximately 4.5 micrometers of the fifth silicon dioxide layer, and resulting in the through silicon via having a thickness of approximately 12.4 micrometers at the top of the silicon wafer and closing the through silicon via within the silicon wafer and at the bottom of the silicon wafer.

17. The process of claim 1, wherein the depositing the sixth silicon dioxide layer on the top of the silicon wafer and the bottom of the silicon wafer comprises a plasma enhanced chemical vapor deposition using tetraethyl orthosilicate (TEOS) chemistry, thereby closing the through silicon via at the top of the silicon wafer, a midpoint of the silicon wafer, and the bottom of the silicon wafer, and resulting in a sixth silicon dioxide layer that is approximately 5 micrometers thick.

18. The process of claim 1, comprising coupling a device to the through silicon via at the top layer of the silicon wafer or coupling a device to the through silicon via at the bottom layer of the silicon wafer.

19. The process of claim 1, comprising chemomechanically polishing (CMP) the sixth silicon dioxide layer down to the copper layer on the top of the silicon wafer and the bottom of the silicon wafer.

20. The process of claim 1, comprising chemomechanically polishing the copper layer, the first adhesion layer, and the second adhesion layer down to the third silicon dioxide layer.

* * * * *

UNITED STATES PATENT AND TRADEMARK OFFICE
CERTIFICATE OF CORRECTION

PATENT NO. : 11,776,849 B2  
APPLICATION NO. : 17/822596  
DATED : October 3, 2023  
INVENTOR(S) : Higashi et al.

Page 1 of 1

It is certified that error appears in the above-identified patent and that said Letters Patent is hereby corrected as shown below:

In the Claims

In Column 10, Line 49, in Claim 7, delete "1-7" and insert --1-4-- therefor

Signed and Sealed this  
Thirty-first Day of December, 2024

Derrick Brent  
*Acting Director of the United States Patent and Trademark Office*